US012580039B2

(12) United States Patent
Jeyachandra et al.

(10) Patent No.: US 12,580,039 B2
(45) Date of Patent: Mar. 17, 2026

(54) VOTING-BASED STATE SELECTION FOR A VOLATILE MEMORY

(71) Applicant: QUALCOMM Incorporated, San Diego, CA (US)

(72) Inventors: Angelin Jeyachandra, Chennai (IN); Venkatraman Chathapuram, Chennai (IN)

(73) Assignee: Qualcomm Incorporated, San Diego, CA (US)

( * ) Notice: Subject to any disclaimer, the term of this patent is extended or adjusted under 35 U.S.C. 154(b) by 136 days.

(21) Appl. No.: 18/611,351

(22) Filed: Mar. 20, 2024

(65) Prior Publication Data

US 2025/0299766 A1     Sep. 25, 2025

(51) Int. Cl.
| | |
|---|---|
| *G11C 29/14* | (2006.01) |
| *G11C 29/20* | (2006.01) |
| *G11C 29/54* | (2006.01) |

(52) U.S. Cl.
CPC .............. *G11C 29/54* (2013.01); *G11C 29/14* (2013.01); *G11C 29/20* (2013.01)

(58) Field of Classification Search
CPC .......... G11C 29/54; G11C 29/14; G11C 29/20
See application file for complete search history.

(56) References Cited

U.S. PATENT DOCUMENTS

| | | | | |
|---|---|---|---|---|
| 2006/0235745 A1* | 10/2006 | Yano | ...................... | G06F 16/951 |
| | | | | 707/E17.108 |
| 2017/0277643 A1* | 9/2017 | Zhou | ...................... | G06F 1/3206 |

* cited by examiner

*Primary Examiner* — Mohammed A Bashar
(74) *Attorney, Agent, or Firm* — Norton Rose Fulbright US LLP

(57) ABSTRACT

An apparatus includes vote aggregation circuitry configured to receive a first plurality of vote signals associated with an active memory state of a volatile memory and to generate a first vote aggregation signal based on the first plurality of vote signals. The vote aggregation circuitry is further configured to receive a second plurality of vote signals associated with a retention memory state of the volatile memory and to generate a second vote aggregation signal based on the second plurality of vote signals. The apparatus further includes memory bank control circuitry coupled to the vote aggregation circuitry and configured to provide a plurality of control signals to the volatile memory based on the first vote aggregation signal and the second vote aggregation signal. The plurality of control signals indicate, for each bank of a plurality of banks of the volatile memory, a mode associated with the bank.

20 Claims, 5 Drawing Sheets

500

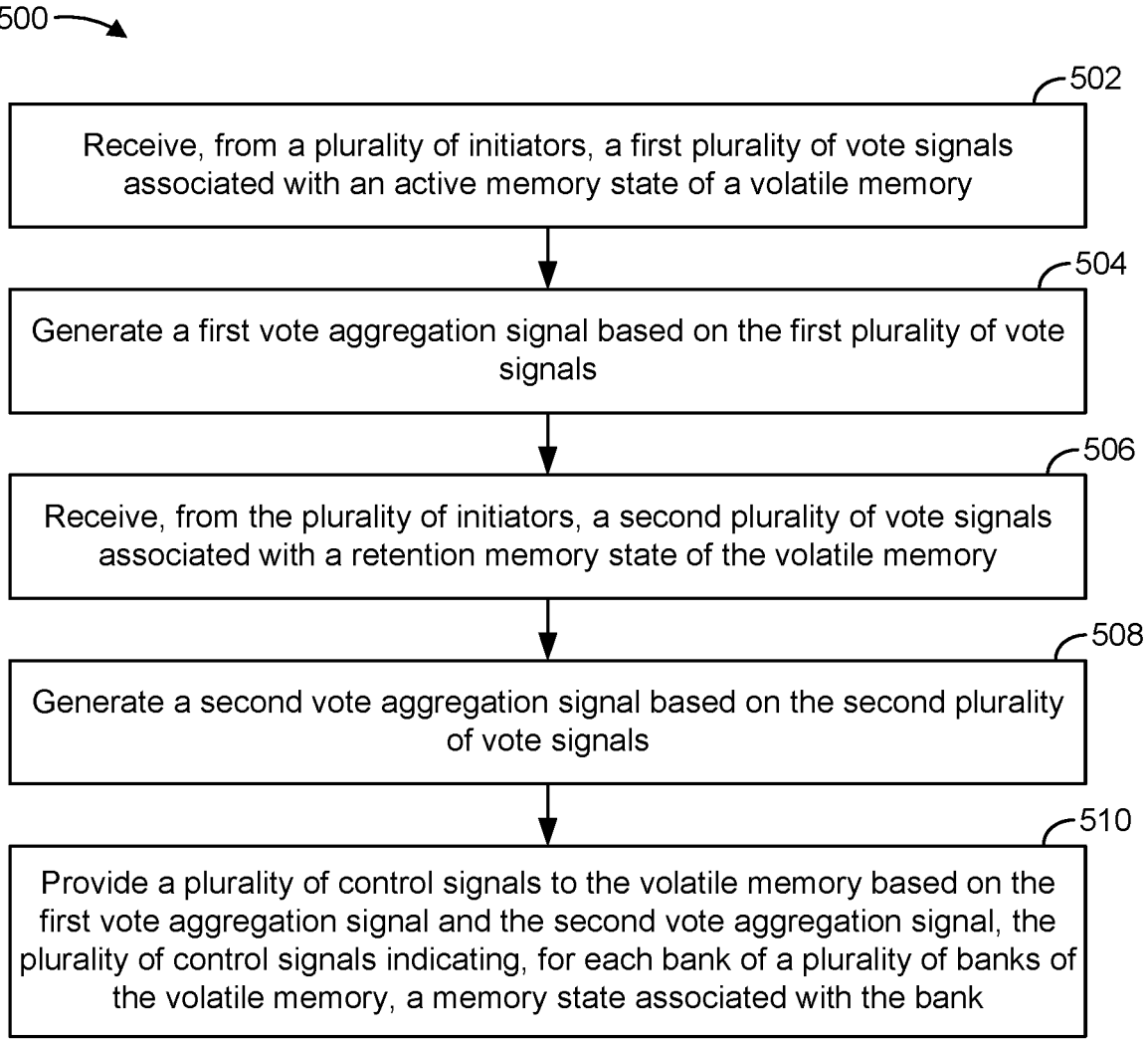

502

Receive, from a plurality of initiators, a first plurality of vote signals associated with an active memory state of a volatile memory

504

Generate a first vote aggregation signal based on the first plurality of vote signals

506

Receive, from the plurality of initiators, a second plurality of vote signals associated with a retention memory state of the volatile memory

508

Generate a second vote aggregation signal based on the second plurality of vote signals

510

Provide a plurality of control signals to the volatile memory based on the first vote aggregation signal and the second vote aggregation signal, the plurality of control signals indicating, for each bank of a plurality of banks of the volatile memory, a memory state associated with the bank

*FIG. 5*

VOTING-BASED STATE SELECTION FOR A VOLATILE MEMORY

TECHNICAL FIELD

Aspects of the present disclosure relate generally to electronic devices, and more particularly, to state selection for volatile memories of electronic devices.

INTRODUCTION

Electronic devices increasingly store and transmit data. For example, electronic devices include components such as processors, transceivers, and input/output (I/O) devices that may generate, process, and store data. As a result, memory devices are increasingly important in electronic devices.

Memory devices include volatile memories and non-volatile memories. Non-volatile memories may maintain stored data after disconnection of a power source, and volatile memories may lose stored data after disconnection of a power source. To maintain data at a volatile memory, refresh operations and other operations may be performed. Such operations may increase power consumption at an electronic device. Further, volatile memories may be relatively expensive to implement and may occupy circuit area of an integrated circuit.

BRIEF SUMMARY OF SOME EXAMPLES

In some aspects of the disclosure, an apparatus includes vote aggregation circuitry configured to receive, from a plurality of initiators, a first plurality of vote signals associated with an active memory state of a volatile memory and to generate a first vote aggregation signal based on the first plurality of vote signals. The vote aggregation circuitry is further configured to receive, from the plurality of initiators, a second plurality of vote signals associated with a retention memory state of the volatile memory and to generate a second vote aggregation signal based on the second plurality of vote signals. The apparatus further includes memory bank control circuitry coupled to the vote aggregation circuitry. The memory bank control circuitry is configured to provide a plurality of control signals to the volatile memory based on the first vote aggregation signal and the second vote aggregation signal. The plurality of control signals indicate, for each bank of a plurality of banks of the volatile memory, a mode associated with the bank.

In some other aspects, a method includes receiving, from a plurality of initiators, a first plurality of vote signals associated with an active memory state of a volatile memory and generating a first vote aggregation signal based on the first plurality of vote signals. The method further includes receiving, from the plurality of initiators, a second plurality of vote signals associated with a retention memory state of the volatile memory and generating a second vote aggregation signal based on the second plurality of vote signals. The method further includes providing a plurality of control signals to the volatile memory based on the first vote aggregation signal and the second vote aggregation signal. The plurality of control signals indicate, for each bank of a plurality of banks of the volatile memory, a memory state associated with the bank.

In some other aspects, an apparatus includes means for receiving, from a plurality of initiators, a first plurality of vote signals associated with an active memory state of a volatile memory, for generating a first vote aggregation signal based on the first plurality of vote signals, for receiving, from the plurality of initiators, a second plurality of vote signals associated with a retention memory state of the volatile memory, and for generating a second vote aggregation signal based on the second plurality of vote signals. The apparatus further includes means for providing a plurality of control signals to the volatile memory based on the first vote aggregation signal and the second vote aggregation signal. The plurality of control signals indicate, for each bank of a plurality of banks of the volatile memory, a mode associated with the bank.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, aspects and/or uses may come about via integrated chip implementations and other non-module-component based devices (e.g., Internet-of-Things (IoT) devices, audio devices, video devices, end-user devices, vehicles, communication devices, computing devices, industrial equipment, retail/purchasing devices, medical devices, artificial intelligence (AI)-enabled devices, etc.).

BRIEF DESCRIPTION OF THE DRAWINGS

FIG. 5 is a flow diagram illustrating an example of a method of memory bank power control according to one or more aspects.

Like reference numbers and designations in the various drawings indicate like elements.

DETAILED DESCRIPTION

Figure 1:
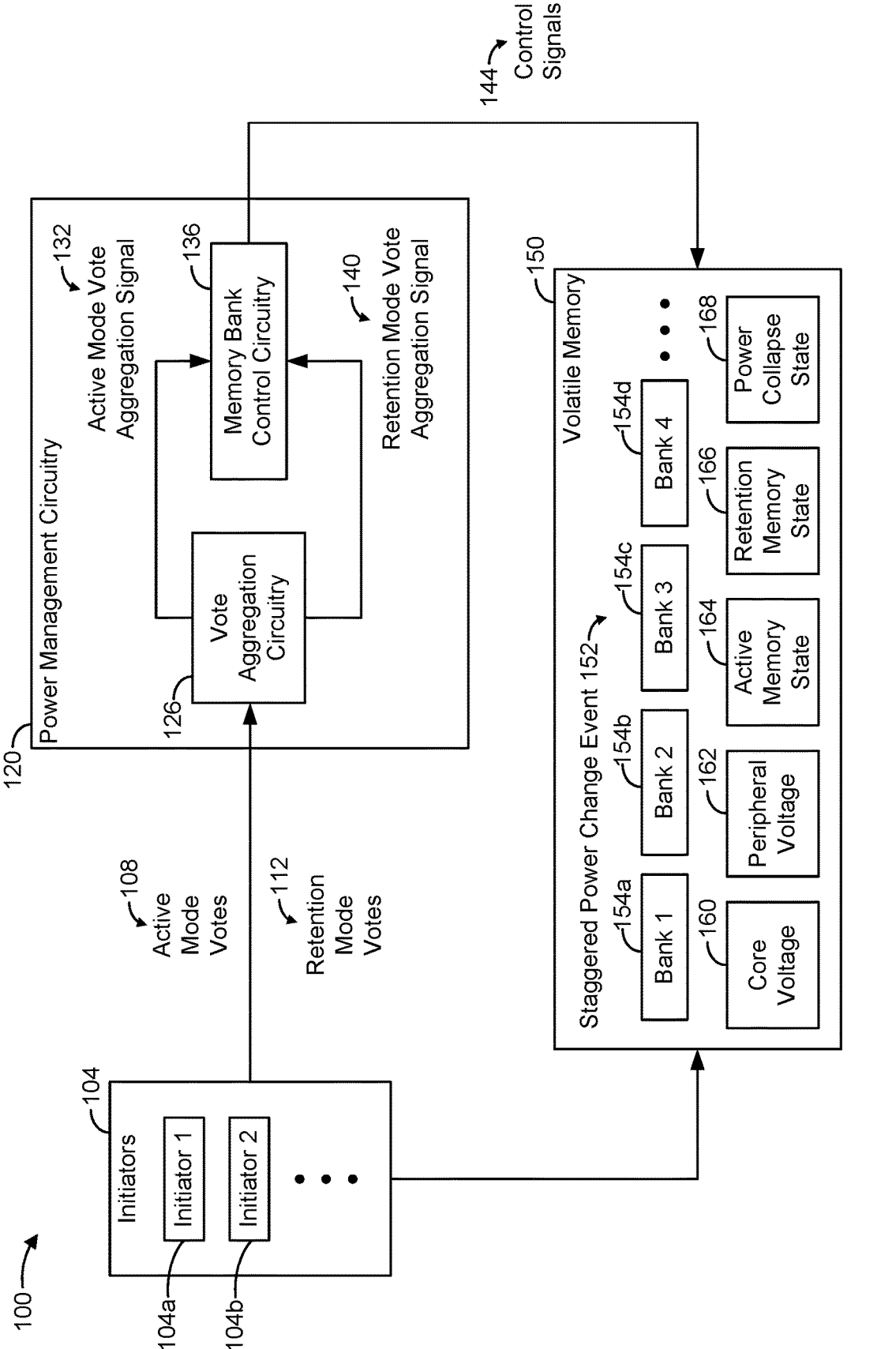
FIG. 1 is a diagram illustrating an example of a system that includes vote aggregation circuitry and memory bank control circuitry for memory bank power control according to one or more aspects.

Some electronic devices may use a shared volatile memory that is accessed by multiple different initiators (also referred to herein as primary devices). For example, such initiators may include an applications processor, an audio application, a modem, or other devices that access the shared volatile memory. In some circumstances, one or more portions of a shared volatile memory may be deactivated to conserve power. For example, if no initiator devices need access to a portion of the shared volatile memory, the portion may be deactivated to conserve power.

To enable disabling the shared volatile memory in such a manner, some electronic devices may use a single initiator to enable and disable portions of the shared volatile memory. For example, the single initiator may correspond to an applications processor that polls other initiators to determine which portions of the shared volatile memory may be disabled. Such an approach may reduce performance in some cases. For example, if the applications processor enters a sleep mode of operation to reduce power consumption, the applications processor may need to be woken to change a state of the shared volatile memory (e.g., to deactivate a portion of the shared volatile memory).

In some aspects of the disclosure, power management circuitry enables initiators to independently "vote" for (or request) one or more modes of operation of a volatile memory. Such votes may be written to registers of the power management circuitry and may be used to generate one or more aggregate vote signals. For example, such aggregate vote signals may be used to select among an active memory state of the volatile memory, a retention memory state of the volatile memory, and a power collapse state of the volatile memory.

In some implementations, vote aggregation may be performed on a "fine grain" basis. For example, vote aggregation may be performed separately for each bank of multiple different banks of the volatile memory. In such examples, each such bank may be separately configurable among the active memory state, the retention memory state, and the power collapse state.

Further, in some implementations, a change in mode associated with the volatile memory may be performed across banks in a staggered manner, such as by sequentially changing modes of multiple different banks of the volatile memory. In some examples, a serial-in, parallel-out (SIPO) shift register may be used to generate a staggered set of parallel outputs, and a parallel-in, parallel-out (PIPO) shift register may be used to adjust values of the staggered set of parallel outputs based on votes from initiator devices (e.g., so that a particular bank is not deactivated if at least one initiator votes to activate the particular bank).

One or more features described herein may improve performance of an electronic device that includes a shared volatile memory. For example, the power management circuitry may enable a hardware-based vote aggregation system in which no single initiator is responsible for activating and deactivating portions of the shared volatile memory. As a result, initiator devices may operate according to a standby mode of operation without being woken to enable and disable portions of the shared volatile memory, reducing power consumption.

As another example, by staggering a change in mode across banks of the shared volatile memory, an inrush current may be reduced as compared to other devices, such as devices that simultaneously deactivate multiple memory banks. By reducing such inrush current, peak power consumption (or average peak power consumption) may be reduced, which may improve performance and which may simplify device design in some cases.

FIG. 1 is a diagram illustrating an example of a system 100 that includes vote aggregation circuitry 126 and memory bank control circuitry 136 for memory bank power control according to one or more aspects. In the example of FIG. 1, the system 100 may include initiators 104, power management circuitry 120, and a volatile memory 150. In some implementations, at least some features illustrated in FIG. 1 may be included in a system-on-chip (SoC) device.

The initiators 104 may be coupled to the power management circuitry 120 and to the volatile memory 150. In the example of FIG. 1, the initiators 104 may include a first initiator 104a and a second initiator 104b. Accordingly, in the example of FIG. 1, the initiators 104 may include two initiators. In some other examples, the initiators 104 may include a different quantity of initiators, such as three or more initiators. The initiators 104 may also be referred to herein as primary devices.

In some examples, the initiators 104 may include processors. For example, the initiators 104 may include one or more application processors (APs), one or more central processor units (CPUs), one or more graphics processing units (GPUs), one or more digital signal processors (DSPs), one or more controllers (e.g., a display controller, an audio controller, or a radio frequency (RF) controller), one or more other processors, or a combination thereof. Alternatively, or in addition, the initiators 104 may include one or more applications executed by a processor. Other examples are also within the scope of the disclosure.

The power management circuitry 120 may be coupled to the initiators 104 and to the volatile memory 150. The power management circuitry 120 may include the vote aggregation circuitry 126 and the memory bank control circuitry 136. The memory bank control circuitry 136 may be coupled to the vote aggregation circuitry 126.

The volatile memory 150 may be coupled to the initiators 104 and to the power management circuitry 120. In some examples, the volatile memory 150 may include a static random access memory (SRAM) or another type of volatile memory. In the example of FIG. 1, the volatile memory 150 may include multiple memory banks, such as a first bank 154a, a second bank 154b, a third bank 154c, and a fourth bank 154d. In such examples, the volatile memory may include four memory banks. In some other examples, the volatile memory may include a different quantity of memory banks, such as two memory banks, three memory banks, or more than four memory banks.

During operation, the initiators 104 may share the volatile memory 150. For example, the initiators 104 may write data to and read data from the volatile memory 150. The initiators 104 may also provide indications to the power management circuitry 120 to request or indicate one or more parameters associated with the volatile memory 150. For example, the initiators 104 may vote on whether to activate or deactivate a core voltage 160 of the volatile memory 150 (e.g., by connecting or disconnecting the volatile memory 150 to or from a voltage rail associated with the core voltage 160). Alternatively, or in addition, the initiators 104 may vote on whether to activate or deactivate a peripheral voltage 162 of the volatile memory 150 (e.g., by connecting or disconnecting the volatile memory 150 to or from a voltage rail associated with the peripheral voltage 162). Further, in some examples, voting may be performed on a per-bank basis. In such examples, each initiator of the initiators 104 may cast multiple votes including a vote for each bank of the banks 154a-d.

By selectively activating or deactivating the core voltage 160 and the peripheral voltage 162, the system 100 may determine a mode of operation of the volatile memory 150. For example, by activating both the core voltage 160 and the peripheral voltage 162, the volatile memory 150 may operate based on an active memory state 164 (e.g., a state in which read and write operations may be performed to the volatile memory 150). As another example, by activating the core voltage 160 and deactivating the peripheral voltage 162, the volatile memory 150 may operate based on a retention memory state 166 (e.g., a state in which data is retained at the volatile memory 150 and in which peripheral circuitry is associated with a standby mode). As a further example, by deactivating both the core voltage 160 and the peripheral voltage 162, the volatile memory 150 may operate based on a power collapse state 168 (e.g., a mode in which no data is retained at the volatile memory 150).

To select a mode of operation of the volatile memory 150, the initiators 104 may provide active mode votes 108 to vote aggregation circuitry 126 to vote for the active memory state 164 or may provide retention mode votes 112 to the vote aggregation circuitry 126 to vote for the retention memory state 166. To illustrate, in some examples, if an initiator of the initiators 104 is to operate based on a power off mode, the initiator may vote for the retention memory state 166. In some other examples, if the initiator is to enter an active mode, the initiator may vote for the active memory state 164. The vote aggregation circuitry 126 may generate an active mode vote aggregation signal 132 based on the active mode votes 108 and may generate a retention mode vote aggregation signal 140 based on the retention mode votes 112. Some illustrative examples that may be associated with an implementation of the vote aggregation circuitry 126 are described further with reference to FIG. 3.

The memory bank control circuitry 136 may receive the active mode vote aggregation signal 132 and the retention mode vote aggregation signal 140 from the vote aggregation circuitry 126. The memory bank control circuitry 136 may generate control signals 144 based at least in part on the active mode vote aggregation signal 132 and the retention mode vote aggregation signal 140. The memory bank control circuitry 136 may provide the control signals 144 to the volatile memory 150. Some illustrative examples that may be associated with an implementation of the memory bank control circuitry 136 are described further with reference to FIG. 2.

The volatile memory 150 may receive the control signals 144 and may determine or adjust one or more settings associated with the volatile memory 150 based on the control signals 144. For example, the volatile memory 150 may selectively activate or deactivate the core voltage 160 and the peripheral voltage 162, which may determine whether the active memory state 164, the retention memory state 166, or the power collapse state 168 is set at the volatile memory 150. In some examples, the active mode vote aggregation signal 132 may set either the active memory state 164, the retention memory state 166, or the power collapse state 168 at the volatile memory 150, and the retention mode vote aggregation signal 140 may set either the memory retention state 166 or the power collapse state 168 at the volatile memory 150. Further, such state selection may be performed on a per-bank basis, such as by independently setting the active memory state 164, the retention memory state 166, or the power collapse state 168 at each of the banks 154a-d independently of the other banks 154a-d.

In some implementations, the volatile memory 150 may perform a staggered power change event 152 based on the control signals 144. The staggered power change event 152 may sequentially change modes of operation at memory banks of the volatile memory 150 (e.g., by changing from one of the active memory state 164, the retention memory state 166, or the power collapse state 168 to another of the active memory state 164, the retention memory state 166, or the power collapse state 168). Some illustrative examples that may be associated with the staggered power change event 152 are described further with reference to FIG. 2.

Figure 2:
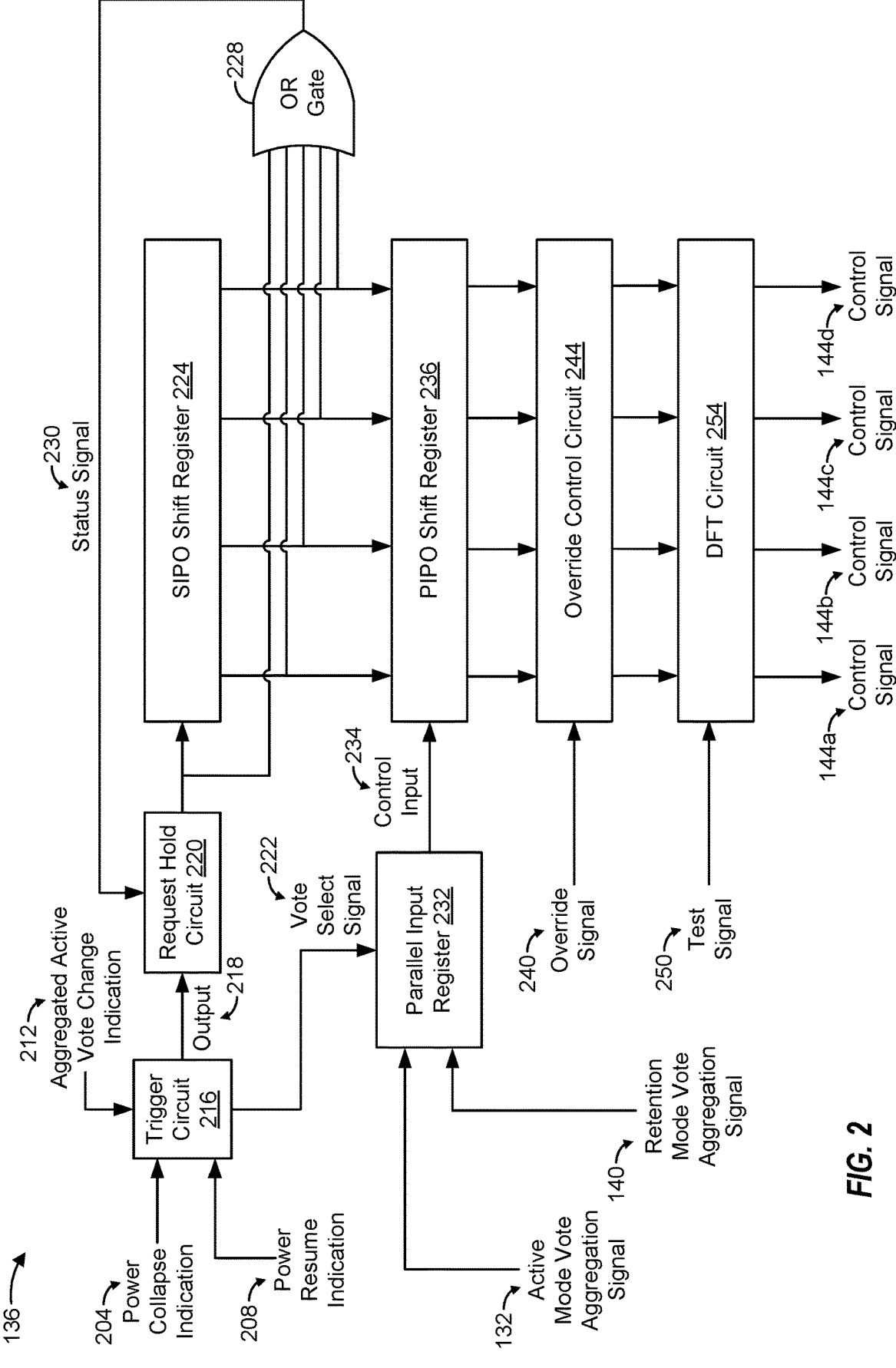
FIG. 2 is a diagram illustrating an example of the memory bank control circuitry of FIG. 1 according to one or more aspects.

FIG. 2 is a diagram illustrating an example of the memory bank control circuitry 136 according to one or more aspects. In the example of FIG. 2, the memory bank control circuitry 136 may include a trigger circuit 216, a request hold circuit 220, a serial-in, parallel-out (SIPO) shift register 224, and an OR gate 228. The memory bank control circuitry 136 may further include a parallel input register 232, a parallel-in, parallel-out (PIPO) shift register 236, an override control circuit 244, and a design-for-testability (DFT) circuit 254. In some examples, the parallel input register 232 may correspond to a PIPO register.

The trigger circuit 216 may be coupled to the request hold circuit 220 and to the parallel input register 232. The request hold circuit 220 may be coupled to the SIPO shift register 224 and to the OR gate 228. The SIPO shift register 224 may be coupled to the request hold circuit 220, to the PIPO shift register 236, and to the OR gate 228. The OR gate 228 may be coupled to the request hold circuit 220 and to the SIPO shift register 224. For example, the OR gate 228 may be coupled to a first output of the request hold circuit 220 and to second outputs (e.g., a set of parallel outputs) of the SIPO shift register 224.

The PIPO shift register 236 may be coupled to the SIPO shift register 224 and to the parallel input register 232 (e.g., to the set of parallel outputs of the SIPO shift register 224). The override control circuit 244 may be coupled to the PIPO shift register 236 (e.g., a set of parallel outputs of the PIPO shift register 236). The DFT circuit 254 may be coupled to the override control circuit 244.

During operation, the trigger circuit 216 may receive one or more indications associated with a change of state of the volatile memory 150. In some examples, such indications may be received from a software program or operating system executed by one or more of the initiators 104. For example, the trigger circuit 216 may receive a power collapse indication 204 indicating that the volatile memory 150 is to undergo a power collapse operation (e.g., initiation of the power collapse state 168). As another example, the trigger circuit 216 may receive a power resume indication 208 indicating that the volatile memory 150 has undergone a power resume operation (e.g., a change from the power collapse state 168 to the active memory state 164 or the retention memory state 166). As an additional example, the trigger circuit 216 may receive an aggregated active vote change indication 212 associated with a change in the active mode votes 108. In some examples, the aggregated active vote change indication 212 may indicate a change in the active mode vote aggregation signal 132.

The trigger circuit 216 may generate an output 218 based on indications associated with a change of state of the volatile memory 150, such as one or more of the power collapse indication 204, the power resume indication 208, or the aggregated active vote change indication 212. The trigger circuit 216 may also generate a vote select signal 222 (e.g., based on the aggregated active vote change indication 212). In some implementations, the vote select signal 222 may include one of an active mode aggregated change indication, a power collapse entry indication, or a power collapse exit indication.

The request hold circuit 220 may receive the output 218 from the trigger circuit 216. Based on a status signal 230, the request hold circuit 220 may selectively hold (e.g., buffer or queue) the output 218 or provide the output 218 to the SIPO shift register 224. The status signal 230 may indicate one of a busy status or a ready status of the SIPO shift register 224. For example, while the SIPO shift register 224 is performing the staggered power change event 152, the status signal 230 may have a first logic value indicating the busy status of the SIPO shift register 224. Upon completion of the staggered power change event 152, the status signal 230 may have a second logic value indicating the ready status of the SIPO shift register 224. Accordingly, the request hold circuit 220 may hold (e.g., mask) the output 218 from the trigger circuit 216 until the status signal 230 indicates the ready status associated with the SIPO shift register 224.

The SIPO shift register 224 may receive the output 218 from the request hold circuit 220. The SIPO shift register 224 may generate the control signals 144 based on the output 218. Further, the SIPO shift register 224 may serially modify the control signals 144 to generate serially modified control signals, which may enable the staggered power change event 152 associated with banks of the volatile memory 150. In such examples, the staggered power change event 152 may be performed based on the serially modified control signals (e.g., by activating or deactivating the banks 154*a-d* in a serial manner).

Figure 4:
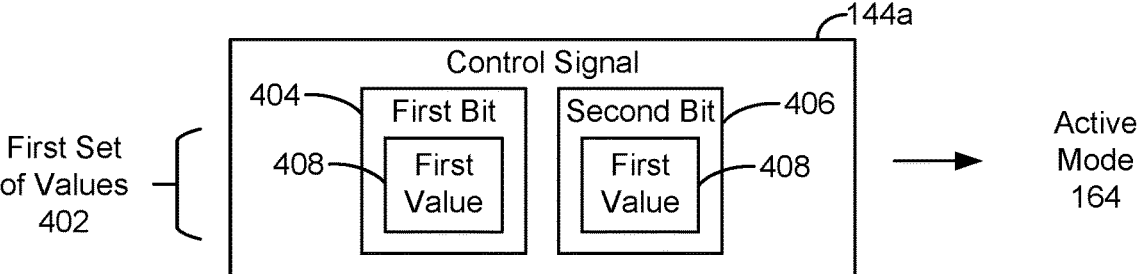
FIG. 4 is a diagram illustrating an example of a control signal according to one or more aspects.
Figure 4:
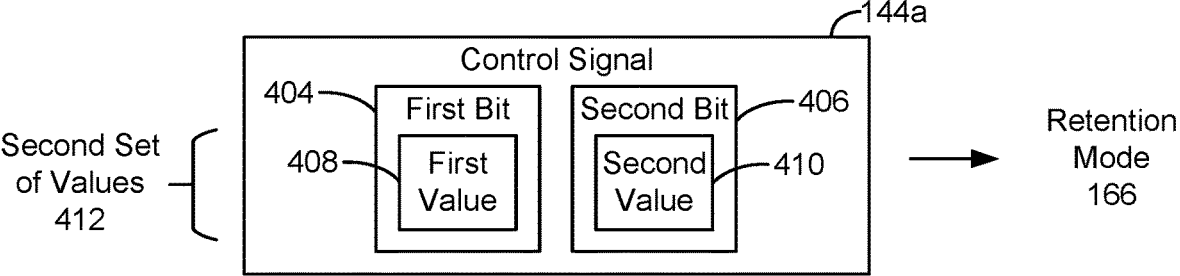
Figure 4:
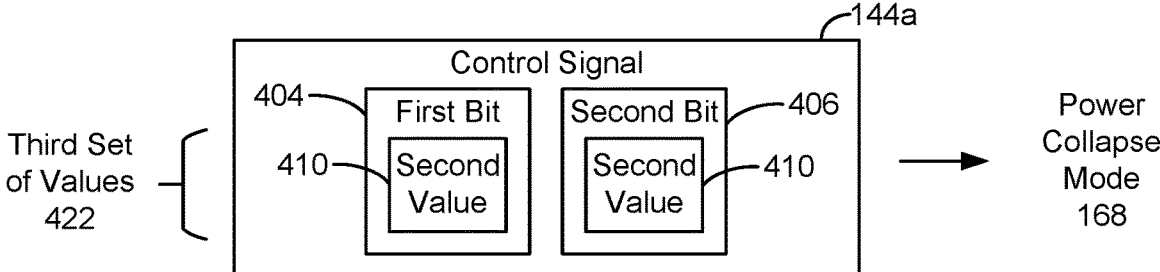

To illustrate, in the example of FIG. 4, the control signals 144*a* may include a first control signal 144*a* associated with the first bank 154*a*, a second control signal 144*b* associated with the second bank 154*b*, a third control signal 144*c* associated with the third bank 154*c*, and a fourth control signal 144*d* associated with the fourth bank 154*d*. Although some examples may illustrate four such control signals (and four banks of the volatile memory 150), other implementations may use a different quantity of control signals (and banks of the volatile memory 150). Further, a quantity of outputs of the SIPO shift register 224, the parallel input register 232, and the PIPO shift register 236 236 may also correspond to the quantity of control signals (and banks of the volatile memory 150).

The SIPO shift register 224 may initialize the control signals 144*a-d* to a first value, such as a logic zero value. Based on receiving the output 218 from the request hold circuit 220, the SIPO shift register 224 may sequentially modify the control signals 144*a-d* from the first logic value to a second logic value (e.g., a logic zero value or a logic one value). Sequentially modifying the control signals 144*a-d* in such a manner may enable the staggered power change event 152, which may reduce a peak current (or an inrush current) associated with concurrent activation or deactivation of the banks 154*a-d*.

Further, in some aspects of the disclosure, the memory bank control circuitry 136 may enable the initiators 104 to set (or "vote" for) modes of banks of the volatile memory 150. To illustrate, the parallel input register 232 may receive the vote select signal 222 from the trigger circuit 216. The vote select signal 222 may have one of a first value indicating a vote for the active memory state 164 or a second value indicating a vote for the retention memory state 166. The parallel input register 232 may provide a control input 234 to the PIPO shift register 236. The PIPO shift register 236 may receive the control signals 144*a-d* from the SIPO shift register 224 and may adjust the plurality of control signals 144*a-d* based on the control input 234.

In some examples, the override control circuit 244 may receive an override signal 240. The override signal 240 may determine a mode of operation of the override control circuit 244. For example, a first value of the override signal 240 may cause the override control circuit 244 to operate in a "pass through" mode, and a second value of the override signal 240 may cause the override control circuit 244 to operate in an override mode. In the override mode, the override control circuit 244 may adjust one or more of the control signals 144*a-d* (e.g., to "force" the volatile memory 150 to enter, or to remain in, a power-on state or a power-off state).

In some examples, the DFT circuit 254 may receive a test signal 250. The test signal 250 may determine a mode of operation of the override control circuit 244. For example, a first value of the test signal 250 may cause the DFT circuit 254 to operate in a test mode, and a second value of the test signal 250 may cause the DFT circuit 254 to operate in a "pass through" mode. In the test mode, the DFT circuit 254 may adjust one or more of the control signals 144*a-d* in connection with a test, such as a self-test, an external test, or another type of test.

The volatile memory 150 of FIG. 1 may receive the control signals 144*a-d* and may perform one or more operations associated with the banks 154*a-d* based on values of the control signals 144*a-d*. In some examples, each of the control signals 144*a-d* corresponds to a multi-bit control signal having a first bit and a second bit. The first bit may selectively activate or deactivate the core voltage 160 (e.g., by connecting the volatile memory 150 to a voltage rail associated with the core voltage 160), and the second bit may selectively activate or deactivate the peripheral voltage 162 (e.g., by connecting the volatile memory 150 to a voltage rail associated with the peripheral voltage 162). As a result, the control signals 144*a-d* may set a mode of operation at each of the banks 154*a-d* of FIG. 1, such as by setting the active memory state 164 (e.g., where both the core voltage 160 and the peripheral voltage 162 are activated), the retention memory state 166 (e.g., where the core voltage 160 is activated and the peripheral voltage 162 is deactivated), or the power collapse state 168 (e.g., where both the core voltage 160 and the peripheral voltage 162 are deactivated).

In some implementations, the devices described herein may include one or more components (e.g., logic gates, circuits, buffers, and other components) that may be omitted from the drawings for clarity of illustration. For example, the memory bank control circuitry 136 illustrated in FIG. 2 may include one or more selection circuits, such as one or more multiplexers (MUXs), which may facilitate one or more operations described herein. To illustrate, in some implementations, an inverter circuit may be coupled between an output of the OR gate 228 and the request hold circuit 220. As another example, in some implementations, one or more data inputs of the SIPO shift register 224 may be coupled to a respective logic gate (e.g., an OR gate), where each OR gate may receive an bypass signal that may be asserted to bypass operation of the SIPO shift register 224. As an additional example, in some implementations, the memory bank control circuitry 136 may include a set of MUXs coupled to the parallel input register 232, to the PIPO shift register 236, to the SIPO shift register 224, and to the OR gate 228. Each such MUX may include a first input, a second input, an enable input, and an output. Each first input may be coupled to a respective parallel output of the parallel input register 232, and each second input may be coupled an output of the PIPO shift register 236. Each enable input may be coupled to a respective input of the OR gate 228, and each output may be coupled to a respective data input of the PIPO shift register 236. Further, in some examples, multiple versions of a component or circuit may be presented as a single component or circuit for clarity of illustration. For example, in some implementations, the system 100 of FIG. 1 may include multiple circuits corresponding to the power management circuitry 120, where one such circuit is associated with core operation of the volatile memory 150, and where another such circuit may be associated with peripheral operation of the volatile memory 150.

Figure 3:
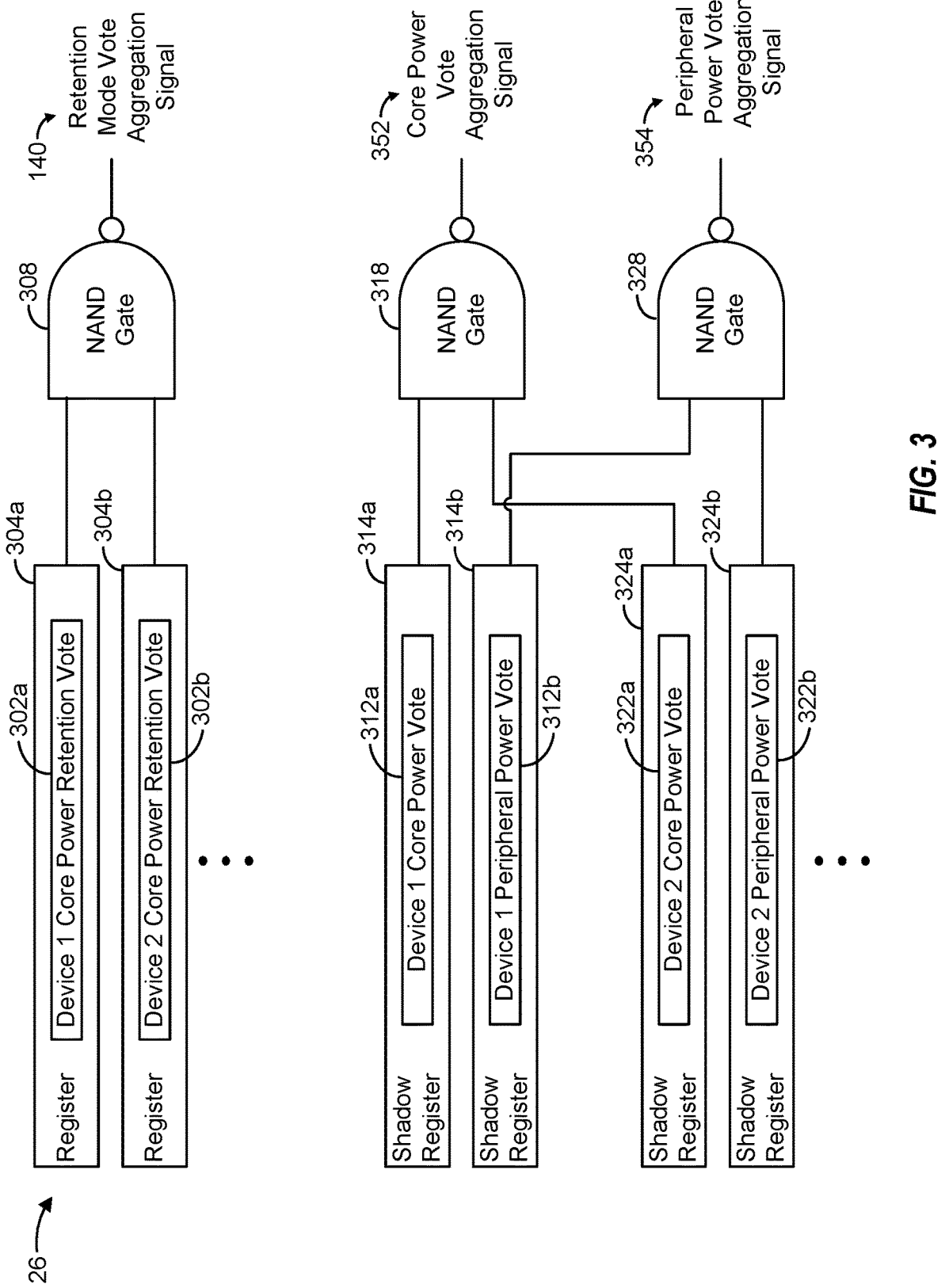
FIG. 3 is a diagram illustrating an example of the vote aggregation circuitry of FIG. 1 according to one or more aspects.

FIG. 3 is a diagram illustrating an example of the vote aggregation circuitry 126 of FIG. 1 according to one or more aspects. In some examples, the vote aggregation circuitry 126 may include a first plurality of registers, a second plurality of registers, and a third plurality of registers. For example, the first plurality of registers may include a register 304*a* and a register 304*b*, the second plurality of registers may include a shadow registers 314*a* and a shadow register 314*b*, and the third plurality of registers may include a shadow register 324*a* and a shadow register 324*b*.

The vote aggregation circuitry 126 may further include a first not-and (NAND) gate 308, a second NAND gate 318, and a third NAND gate 328. The first NAND gate 308 may include first inputs coupled to the first plurality of registers and may further include a first output coupled to the memory bank control circuitry 136 (e.g., to the parallel input register 232). The second NAND gate 318 may include second inputs coupled to the second plurality of registers and may further include a second output coupled to the memory bank control circuitry 136 (e.g., to the parallel input register 232). The third NAND gate 328 may include third inputs coupled to the third plurality of registers and may further include a third output coupled to the memory bank control circuitry 136 (e.g., to the parallel input register 232).

During operation, the initiators 104 may store values to the registers 302*a*-*b*, 312*a*-*b*, and 312*a*-*b*. For example, the first initiator 104*a* may store a core power retention vote 302*a* to the register 304*a*, a core power vote 312*a* to the shadow register 314*a*, and a peripheral power vote 312*b* to the shadow register 314*b*. As another example, the second initiator 104*b* may store a core power retention vote 302*b* to the register 304*b*, a core power vote 322*a* to the shadow register 324*a*, and a peripheral power vote 322*b* to the shadow register 324*b*.

The first NAND gate 308 may perform a NAND operation based on the core power retention votes 302*a*-*b* to generate the retention mode vote aggregation signal 140. The second NAND gate 318 may perform a NAND operation based on the core power votes 312*a* and 322*a* to generate a core power vote aggregation signal 352, and the third NAND gate 328 may perform a NAND operation based on the peripheral power votes 312*b* and 322*b* to generate a peripheral power vote aggregation signal 354. In some examples, the retention mode vote aggregation signal 140, core power vote aggregation signal 352, and peripheral power vote aggregation signal 354 may be provided to the parallel input register 232 of FIG. 2. In some examples, the parallel input register 232 may generate the control input 234 based on any of the active mode vote aggregation signal 132, the retention mode vote aggregation signal 140, the core power vote aggregation signal 352, and the peripheral power vote aggregation signal 354.

In some examples, each of the control signals 144*a*-*d* may be provided to a respective AND gate. The AND gates may perform AND operations based on the control signals 144*a*-*d* and further based on an aggregate vote signal to generate a set of bank status signals respectively associated with the banks 154*a*-*d*. In some implementations, each such bank status signal may indicate the memory state associated with the respective bank (e.g., the active memory state 164, the retention memory state 166, or the power collapse state 168 of FIG. 1).

FIG. 4 is a diagram illustrating an example of the first control signal 144*a* according to one or more aspects. In the example of FIG. 4, the first control signal 144*a* is a multi-bit control signal having a first bit 404 and a second bit 406.

In some examples, the first bit 404 may be associated with the core voltage 160 at the first bank 154*a*, and the second bit 406 may be associated with the peripheral voltage 162 at the first bank 154*a*. To illustrate, referring to the first bit 404, a first value 408 (e.g., a logic one value or a logic zero value) may indicate that the core voltage 160 is to be activated at the first bank 154*a*, and a second value 410 (e.g., a logic zero value or a logic one value) may indicate that the core voltage 160 is to be deactivated at the first bank 154*a*. Referring to the second bit 406, the first value 408 may indicate that the peripheral voltage 162 is to be activated at the first bank 154*a*, and the second value 410 may indicate that the core voltage 160 is to be deactivated at the first bank 154*a*.

Values of the first bit 404 and the second bit 406 may determine a mode of operation of the first bank 154*a*. For example, a first set of values 402 may include the first value 408 of the first bit 404 and the first value 408 of the second bit 406. The first set of values 402 may indicate or may be associated with the active memory state 164 at the first bank 154*a*. As another example, a second set of values 412 may include the first value 408 of the first bit 404 and the second value 410 of the second bit 406. The second set of values 412 may indicate or may be associated with the retention memory state 166 at the first bank 154*a*. As a further example, a third set of values 422 may include the second value 410 of the first bit 404 and the second value 410 of the second bit 406. The third set of values 422 may indicate or may be associated with the power collapse state 168 at the first bank 154*a*.

Further, although FIG. 4 is described with reference to the first control signal 144*a* for illustration, it will be appreciated that other control signals described herein may be multi-bit control signals having multiple bits as described with reference to the first control signal 144*a*. For example, values of bits of the control signals 144*b*-*d* may be used to determine modes of operation of the banks 154*b*-*d*, respectively.

FIG. 5 is a flow diagram illustrating an example of a method 500 of memory bank power control according to one or more aspects. In some examples, the method 500 may be performed at the system 100 of FIG. 1, such as by the power management circuitry 120.

The method 500 includes receiving, from a plurality of initiators, a first plurality of vote signals associated with an active memory state of a volatile memory, at 502. For example, the vote aggregation circuitry 126 may receive the active mode votes 108 from the initiators 104, and the active mode votes 108 may be associated with the active memory state 164 of the volatile memory 150.

The method 500 further includes generating a first vote aggregation signal based on the first plurality of vote signals, at 504. For example, the vote aggregation circuitry 126 may generate the active mode vote aggregation signal 132 based on the active mode votes 108.

The method 500 further includes receiving, from the plurality of initiators, a second plurality of vote signals associated with a retention memory state of the volatile memory, at 506. For example, the vote aggregation circuitry 126 may receive the retention mode votes 112 from the initiators 104, and the retention mode votes 112 may be associated with the retention memory state 166 of the volatile memory.

The method 500 further includes generating a second vote aggregation signal based on the second plurality of vote signals, at 508. For example, the vote aggregation circuitry 126 may generate the retention mode vote aggregation signal 140 based on the retention mode votes 112.

The method 500 further includes providing a plurality of control signals to the volatile memory based on the first vote aggregation signal and the second vote aggregation signal, at 510. The plurality of control signals indicate, for each bank of a plurality of banks of the volatile memory, a memory state associated with the bank. For example, the memory bank control circuitry 136 may provide the control signals 144 to the volatile memory 150 based on the active mode vote aggregation signal 132 and the retention mode vote aggregation signal 140. The control signals 144 may indicate, for each bank of the volatile memory 150, a memory state associated with the bank, such as the active memory state 164, the retention memory state 166, or the power collapse state 168.

In some implementations, the method 500 may further include serially modifying the plurality of control signals to generate serially modified control signals prior to providing the plurality of control signals to the volatile memory and performing a staggered power change event associated with the plurality of banks based on the serially modified control signals. For example, the SIPO shift register 224 may serially modify the control signals 144 to generate serially modified control signals, and the staggered power change event 152 may be performed based on the serially modified control signals.

In some aspects, an apparatus includes means (e.g., the vote aggregation circuitry 126) for receiving, from a plurality of initiators, a first plurality of vote signals associated with an active memory state of a volatile memory, for generating a first vote aggregation signal based on the first plurality of vote signals, for receiving, from the plurality of initiators, a second plurality of vote signals associated with a retention memory state of the volatile memory, and for generating a second vote aggregation signal based on the second plurality of vote signals. The apparatus further includes means (e.g., the memory bank control circuitry 136) for providing a plurality of control signals to the volatile memory based on the first vote aggregation signal and the second vote aggregation signal, the plurality of control signals indicating, for each bank of a plurality of banks of the volatile memory, a mode associated with the bank. The apparatus may further include means (e.g., the SIPO shift register 224) for serially modifying the plurality of control signals to enable a staggered power change event associated with the plurality of banks of the volatile memory.

To further illustrate some aspects of the disclosure, in some examples, two sets of software votes may be received from multiple primary devices. The software votes may include an active vote, which may be applied upon core power collapse exit or upon a change in active mode vote. The software votes may also include a retention vote, which may be applied upon power collapse entry. Software votes may be copied to shadow register when no power staggering is occurring, which may allow software voting irrespective of whether power staggering is occurring. Aggregated votes may be generated based on contents of the shadow registers, and aggregated votes from the multiple primary devices may be applied to memory in a staggered manner to reduce or avoid inrush current.

Registers may be programmed with a CORE_RAIL_OFF value and a PERIPHERAL_RAIL_OFF value. Such values may be shadowed to local registers if a status signal (CMP_STS) has a particular value (e.g., a logic one value). If CMP_STS has another value (e.g., a logic zero value), shadowing may wait to be performed until CMP_STS has the particular value. After performing shadowing, if a change in voting occurs for any primary device, staggering may be initiated. In this case, the value of CMP_STS may be set to the other value (e.g., a logic zero value). While CMP_STS has the other value, any new voting for CORE_RAIL_OFF and PERIPHERAL_RAIL_OFF may not be copied to the shadow registers.

Each bank of the memory may be associated with an on-or-off (ON/OFF) status. A logic AND operation may be performed based on each ON/OFF status and the aggregated vote and may be provided as BANK_STATUS for polling (e.g., to enable the primary devices to determine a status associated with each bank). For example, the primary devices may poll BANK_STATUS and may access each such bank only if BANK_STATUS indicates that the bank is in an on state.

One or more features described herein may improve performance of an electronic device that includes a shared volatile memory, such as the volatile memory 150. For example, the power management circuitry 120 may enable a hardware-based vote aggregation system in which no single initiator 104 is responsible for activating and deactivating portions of the volatile memory 150. As a result, the initiators 104 may operate according to a standby mode of operation without being woken to enable and disable portions of the volatile memory 150, reducing power consumption.

As another example, by staggering a change in mode across the banks 154a-d, an inrush current may be reduced as compared to other devices, such as devices that simultaneously deactivate multiple memory banks. By reducing such inrush current, peak power consumption (or average peak power consumption) may be reduced, which may improve performance and which may simplify device design in some cases.

To further illustrate some aspects, in a first aspect, an apparatus includes vote aggregation circuitry configured to receive, from a plurality of initiators, a first plurality of vote signals associated with an active memory state of a volatile memory and to generate a first vote aggregation signal based on the first plurality of vote signals. The vote aggregation circuitry is further configured to receive, from the plurality of initiators, a second plurality of vote signals associated with a retention memory state of the volatile memory and to generate a second vote aggregation signal based on the second plurality of vote signals. The apparatus further includes memory bank control circuitry coupled to the vote aggregation circuitry. The memory bank control circuitry is configured to provide a plurality of control signals to the volatile memory based on the first vote aggregation signal and the second vote aggregation signal. The plurality of control signals indicate, for each bank of a plurality of banks of the volatile memory, a mode associated with the bank.

In a second aspect, in combination with the first aspect, at least a first control signal of the plurality of control signals corresponds to a multi-bit control signal having a first bit and a second bit, the first bit is associated with a core voltage of a first bank of the plurality of banks, and the second bit is associated with a peripheral voltage of the first bank.

In a third aspect, in combination with one or more of the first aspect or the second aspect, a first set of values of the first bit and the second bit indicate the active memory state for the first bank, a second set of values of the first bit and the second bit indicate the retention memory state for the first bank, and a third set of values of the first bit and the second bit indicate a power collapse state for the first bank.

In a fourth aspect, in combination with one or more of the first aspect through the third aspect, the memory bank control circuitry includes a serial-in, parallel-out (SIPO) shift register configured to generate the plurality of control signals and to serially modify the plurality of control signals to enable a staggered power change event associated with the plurality of banks of the volatile memory.

In a fifth aspect, in combination with one or more of the first aspect through the fourth aspect, the memory bank control circuitry further includes a parallel input register coupled to the vote aggregation circuitry and a parallel-in, parallel-out (PIPO) shift register configured to receive the plurality of control signals from the SIPO shift register and to selectively adjust the plurality of control signals based on a control input from the parallel input register.

In a sixth aspect, in combination with one or more of the first aspect through the fifth aspect, the memory bank control circuitry further includes a trigger circuit and a request hold circuit coupled to the trigger circuit and to the SIPO shift register. The trigger circuit is configured to generate an output based on one or more of an aggregate vote change indication associated with one or more initiators of the plurality of initiators, a power collapse indication associated with the volatile memory, or a power resume indication associated with the volatile memory.

In a seventh aspect, in combination with one or more of the first aspect through the sixth aspect, the apparatus further includes an OR gate coupled to a first output of the request hold circuit and to second outputs of the SIPO shift register, and the OR gate is configured to provide a status signal to the request hold circuit.

In an eighth aspect, in combination with one or more of the first aspect through the seventh aspect, the request hold circuit is configured to hold the output until the status signal indicates a ready status associated with the SIPO shift register.

In a ninth aspect, in combination with one or more of the first aspect through the eighth aspect, the vote aggregation circuitry includes a first plurality of registers configured to store first values associated with the first plurality of vote signals and a first not-and (NAND) gate including first inputs coupled to the first plurality of registers and further including a first output coupled to the memory bank control circuitry.

In a tenth aspect, in combination with one or more of the first aspect through the ninth aspect, the vote aggregation circuitry further includes a second plurality of registers configured to store second values associated with the second plurality of vote signals and a second NAND gate including second inputs coupled to the second plurality of registers and further including a second output coupled to the memory bank control circuitry.

In an eleventh aspect, in combination with one or more of the first aspect through the tenth aspect, the apparatus further includes an override control circuit configured to receive an override signal and to adjust one or more of the plurality of control signals based on the override signal.

In a twelfth aspect, in combination with one or more of the first aspect through the eleventh aspect, the apparatus further includes a design-for-testability (DFT) circuit configured to receive a test signal and to adjust one or more of the plurality of control signals based on the test signal.

In a thirteenth aspect, a method includes receiving, from a plurality of initiators, a first plurality of vote signals associated with an active memory state of a volatile memory and generating a first vote aggregation signal based on the first plurality of vote signals. The method further includes receiving, from the plurality of initiators, a second plurality of vote signals associated with a retention memory state of the volatile memory and generating a second vote aggregation signal based on the second plurality of vote signals. The method further includes providing a plurality of control signals to the volatile memory based on the first vote aggregation signal and the second vote aggregation signal. The plurality of control signals indicate, for each bank of a plurality of banks of the volatile memory, a memory state associated with the bank.

In a fourteenth aspect, in combination with the thirteenth aspect, at least a first control signal of the plurality of control signals corresponds to a multi-bit control signal having a first bit and a second bit, the first bit is associated with a core voltage of a first bank of the plurality of banks, and the second bit is associated with a peripheral voltage of the first bank.

In a fifteenth aspect, in combination with one or more of the thirteenth aspect through the fourteenth aspect, a first set of values of the first bit and the second bit indicate the active memory state for the first bank, a second set of values of the first bit and the second bit indicate the retention memory state for the first bank, and a third set of values of the first bit and the second bit indicate a power collapse state for the first bank.

In a sixteenth aspect, in combination with one or more of the thirteenth aspect through the fifteenth aspect, the method further includes serially modifying the plurality of control signals prior to providing the plurality of control signals to the volatile memory to generate serially modified control signals and performing a staggered power change event associated with the plurality of banks based on the serially modified control signals.

In a seventeenth aspect, an apparatus includes means for receiving, from a plurality of initiators, a first plurality of vote signals associated with an active memory state of a volatile memory, for generating a first vote aggregation signal based on the first plurality of vote signals, for receiving, from the plurality of initiators, a second plurality of vote signals associated with a retention memory state of the volatile memory, and for generating a second vote aggregation signal based on the second plurality of vote signals. The apparatus further includes means for providing a plurality of control signals to the volatile memory based on the first vote aggregation signal and the second vote aggregation signal. The plurality of control signals indicate, for each bank of a plurality of banks of the volatile memory, a mode associated with the bank.

In an eighteenth aspect, in combination with the seventeenth aspect, at least a first control signal of the plurality of control signals corresponds to a multi-bit control signal having a first bit and a second bit, the first bit is associated with a core voltage of a first bank of the plurality of banks, and the second bit is associated with a peripheral voltage of the first bank.

In a nineteenth aspect, in combination with one or more of the first aspect through the eighteenth aspect, a first set of values of the first bit and the second bit indicate the active memory state for the first bank, a second set of values of the first bit and the second bit indicate the retention memory state for the first bank, and a third set of values of the first bit and the second bit indicate a power collapse state for the first bank.

In a twentieth aspect, in combination with one or more of the first aspect through the nineteenth aspect, the apparatus further includes means for serially modifying the plurality of control signals to enable a staggered power change event associated with the plurality of banks of the volatile memory.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

One or more components, functional blocks, and modules described herein may include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. In addition, features discussed herein may be implemented via processor circuitry, via executable instructions, or combinations thereof.

Those of skill would further appreciate that the various illustrative logical blocks, modules, circuits, and operations described herein may be implemented as electronic hardware, computer software, or combinations of both. To illustrate, various illustrative components, blocks, modules, circuits, and operations may be described generally. Whether such functionality is implemented as hardware or software may depend upon the particular application and design of the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are illustrative and that the components, methods, or interactions of the various aspects of the disclosure may be combined or performed in ways other than those illustrated and described herein.

A hardware and data processing apparatus used to implement the various illustrative logics, logical blocks, modules and circuits described in connection with the aspects disclosed herein may be implemented or performed with a single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor may be a microprocessor, controller, microcontroller, state machine, or other type of processor. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, that is one or more modules of computer program instructions, encoded on a computer storage media for execution by, or to control the operation of, a data processing apparatus.

If implemented in software, the functions may be stored on or transmitted over as one or more instructions or code on a computer-readable medium. The processes of a method or process disclosed herein may be implemented in a processor-executable software module which may reside on a computer-readable medium. Computer-readable media includes computer storage media. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or process may reside as one or any combination or set of codes and instructions on a machine readable medium and computer-readable medium, which may be incorporated into a computer program product.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the features described herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
vote aggregation circuitry configured to receive, from a plurality of initiators, a first plurality of vote signals associated with an active memory state of a volatile memory, to generate a first vote aggregation signal based on the first plurality of vote signals, to receive, from the plurality of initiators, a second plurality of vote signals associated with a retention memory state of the volatile memory, and to generate a second vote aggregation signal based on the second plurality of vote signals; and
memory bank control circuitry coupled to the vote aggregation circuitry, the memory bank control circuitry configured to provide a plurality of control signals to the volatile memory based on the first vote aggregation signal and the second vote aggregation signal, the plurality of control signals indicating, for each bank of a plurality of banks of the volatile memory, a mode.

2. The apparatus of claim 1, wherein at least a first control signal of the plurality of control signals corresponds to a multi-bit control signal having a first bit and a second bit, wherein the first bit is associated with a core voltage of a first bank of the plurality of banks, and wherein the second bit is associated with a peripheral voltage of the first bank.

3. The apparatus of claim 2, wherein a first set of values of the first bit and the second bit indicate the active memory state for the first bank, wherein a second set of values of the first bit and the second bit indicate the retention memory state for the first bank, and wherein a third set of values of the first bit and the second bit indicate a power collapse state for the first bank.

4. The apparatus of claim 1, wherein the memory bank control circuitry comprises a serial-in, parallel-out (SIPO) shift register configured to generate the plurality of control signals and to serially modify the plurality of control signals to enable a staggered power change event associated with the plurality of banks of the volatile memory.

5. The apparatus of claim 4, wherein the memory bank control circuitry further comprises:

a parallel input register coupled to the vote aggregation circuitry; and
a parallel-in, parallel-out (PIPO) shift register configured to receive the plurality of control signals from the SIPO shift register and to selectively adjust the plurality of control signals based on a control input from the parallel input register.

6. The apparatus of claim 4, wherein the memory bank control circuitry further comprises:
a trigger circuit configured to generate an output based on one or more of an aggregate vote change indication associated with one or more initiators of the plurality of initiators, a power collapse indication associated with the volatile memory, or a power resume indication associated with the volatile memory; and
a request hold circuit coupled to the trigger circuit and to the SIPO shift register.

7. The apparatus of claim 6, further comprising an OR gate coupled to a first output of the request hold circuit and to second outputs of the SIPO shift register, wherein the OR gate is configured to provide a status signal to the request hold circuit.

8. The apparatus of claim 7, wherein the request hold circuit is configured to hold the output until the status signal indicates a ready status associated with the SIPO shift register.

9. The apparatus of claim 1, wherein the vote aggregation circuitry includes:
a first plurality of registers configured to store first values associated with the first plurality of vote signals; and
a first not-and (NAND) gate including first inputs coupled to the first plurality of registers and further including a first output coupled to the memory bank control circuitry.

10. The apparatus of claim 9, wherein the vote aggregation circuitry further includes:
a second plurality of registers configured to store second values associated with the second plurality of vote signals; and
a second NAND gate including second inputs coupled to the second plurality of registers and further including a second output coupled to the memory bank control circuitry.

11. The apparatus of claim 1, further comprising an override control circuit configured to receive an override signal and to adjust one or more of the plurality of control signals based on the override signal.

12. The apparatus of claim 1, further comprising a design-for-testability (DFT) circuit configured to receive a test signal and to adjust one or more of the plurality of control signals based on the test signal.

13. A method comprising:
receiving, from a plurality of initiators, a first plurality of vote signals associated with an active memory state of a volatile memory;
generating a first vote aggregation signal based on the first plurality of vote signals;
receiving, from the plurality of initiators, a second plurality of vote signals associated with a retention memory state of the volatile memory;
generating a second vote aggregation signal based on the second plurality of vote signals; and
providing a plurality of control signals to the volatile memory based on the first vote aggregation signal and the second vote aggregation signal, the plurality of control signals indicating, for each bank of a plurality of banks of the volatile memory, a memory state.

14. The method of claim 13, wherein at least a first control signal of the plurality of control signals corresponds to a multi-bit control signal having a first bit and a second bit, wherein the first bit is associated with a core voltage of a first bank of the plurality of banks, and wherein the second bit is associated with a peripheral voltage of the first bank.

15. The method of claim 14, wherein a first set of values of the first bit and the second bit indicate the active memory state for the first bank, wherein a second set of values of the first bit and the second bit indicate the retention memory state for the first bank, and wherein a third set of values of the first bit and the second bit indicate a power collapse state for the first bank.

16. The method of claim 13, further comprising:

prior to providing the plurality of control signals to the volatile memory, serially modifying the plurality of control signals to generate serially modified control signals; and performing a staggered power change event associated with the plurality of banks based on the serially modified control signals.

17. An apparatus comprising:

means for receiving, from a plurality of initiators, a first plurality of vote signals associated with an active memory state of a volatile memory, for generating a first vote aggregation signal based on the first plurality of vote signals, for receiving, from the plurality of initiators, a second plurality of vote signals associated with a retention memory state of the volatile memory, and for generating a second vote aggregation signal based on the second plurality of vote signals; and means for providing a plurality of control signals to the volatile memory based on the first vote aggregation signal and the second vote aggregation signal, the plurality of control signals indicating, for each bank of a plurality of banks of the volatile memory, a mode.

18. The apparatus of claim 17, wherein at least a first control signal of the plurality of control signals corresponds to a multi-bit control signal having a first bit and a second bit, wherein the first bit is associated with a core voltage of a first bank of the plurality of banks, and wherein the second bit is associated with a peripheral voltage of the first bank.

19. The apparatus of claim 18, wherein a first set of values of the first bit and the second bit indicate the active memory state for the first bank, wherein a second set of values of the first bit and the second bit indicate the retention memory state for the first bank, and wherein a third set of values of the first bit and the second bit indicate a power collapse state for the first bank.

20. The apparatus of claim 17, further comprising means for serially modifying the plurality of control signals to enable a staggered power change event associated with the plurality of banks of the volatile memory.

* * * * *